(12) United States Patent
Hong et al.

(10) Patent No.: US 11,476,681 B2
(45) Date of Patent: Oct. 18, 2022

(54) BATTERY MANAGEMENT APPARATUS AND METHOD

(71) Applicant: LG CHEM, LTD., Seoul (KR)

(72) Inventors: Sung-Ju Hong, Daejeon (KR);
Dong-Hyun Kim, Daejeon (KR);
Seung-Hwan Kim, Daejeon (KR);
Dong-Chun Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 162 days.

(21) Appl. No.: 16/772,501

(22) PCT Filed: Oct. 11, 2019

(86) PCT No.: PCT/KR2019/013386
§ 371 (c)(1),
(2) Date: Jun. 12, 2020

(87) PCT Pub. No.: WO2020/076126
PCT Pub. Date: Apr. 16, 2020

(65) Prior Publication Data
US 2020/0389034 A1   Dec. 10, 2020

(30) Foreign Application Priority Data

Oct. 12, 2018 (KR) .................. 10-2018-0122131

(51) Int. Cl.
*H02J 7/00* (2006.01)
*G01R 31/396* (2019.01)
(Continued)

(52) U.S. Cl.
CPC .......... *H02J 7/0019* (2013.01); *G01R 19/165* (2013.01); *G01R 31/3835* (2019.01);
(Continued)

(58) Field of Classification Search
USPC ................ 320/107, 118, 121, 126
See application file for complete search history.

(56) References Cited

U.S. PATENT DOCUMENTS

2006/0181244 A1   8/2006   Luo et al.
2011/0221394 A1   9/2011   Shigemizu et al.
(Continued)

FOREIGN PATENT DOCUMENTS

CN   102208820 A   * 10/2011
CN   103647327 A   *  3/2014
(Continued)

OTHER PUBLICATIONS

International Search Report issued in corresponding International Patent Application No. PCT/KR2019/013386, dated Jan. 23, 2020.
(Continued)

*Primary Examiner* — Brian Ngo
(74) *Attorney, Agent, or Firm* — Morgan, Lewis & Bockius LLP

(57) ABSTRACT

A battery management apparatus according to the present disclosure may include a sensing unit detachably mounted to a battery system and configured to measure a voltage of a cell assembly included in a battery pack, which is electrically connected to another battery pack in parallel, when being mounted to the battery system; a balancing circuit having a balancing resistor connected to a charging and discharging path of the cell assembly in parallel and a balancing switch for electrically connecting or disconnecting the cell assembly and the balancing resistor; and a processor operably coupled to the sensing unit and the balancing circuit.

17 Claims, 4 Drawing Sheets

(51) Int. Cl.
  *G01R 31/3835* (2019.01)
  *G01R 19/165* (2006.01)
  *H01M 10/42* (2006.01)

(52) U.S. Cl.
  CPC ........ *G01R 31/396* (2019.01); *H01M 10/425* (2013.01); *H01M 2010/4271* (2013.01)

(56) References Cited

U.S. PATENT DOCUMENTS

| | | | |
|---|---|---|---|
| 2012/0313439 A1 | 12/2012 | Yamaguchi et al. | |
| 2014/0009106 A1* | 1/2014 | Andrea | H02J 7/0018 320/107 |
| 2014/0042977 A1 | 2/2014 | Kim | |
| 2014/0152261 A1* | 6/2014 | Yamauchi | G01R 31/396 320/118 |
| 2015/0244190 A1* | 8/2015 | Yamamoto | H02J 7/0014 320/126 |
| 2016/0241052 A1 | 8/2016 | Yang | |
| 2017/0054134 A1 | 2/2017 | Choi et al. | |
| 2018/0191177 A1 | 7/2018 | Sundaraaman | |
| 2020/0039358 A1* | 2/2020 | Duan | H02J 7/007182 |

FOREIGN PATENT DOCUMENTS

| | | | | |
|---|---|---|---|---|
| CN | 104094494 B | * | 6/2016 | ............. B60L 58/12 |
| CN | 106786953 A | * | 5/2017 | |
| CN | 106953391 A | | 7/2017 | |
| CN | 107017685 A | * | 8/2017 | |
| CN | 207939219 U | * | 10/2018 | |
| FR | 3029639 A1 | * | 6/2016 | |
| GB | 2545587 A | * | 6/2017 | |
| JP | 2010-45923 A | | 2/2010 | |
| JP | 2010-98824 A | | 4/2010 | |
| JP | 2011-182623 A | | 9/2011 | |
| JP | 2011182623 A | * | 9/2011 | ......... H01M 10/441 |
| JP | 2012-85461 A | | 4/2012 | |
| JP | 5143185 B2 | | 2/2013 | |
| JP | 2016-40999 A | | 3/2016 | |
| JP | 10-2017-0022417 A | | 3/2017 | |
| JP | 10-1720960 B1 | | 3/2017 | |
| KR | 10-2013-0071950 A | | 7/2013 | |
| KR | 10-2014-0021486 A | | 2/2014 | |
| KR | 10-1601717 B1 | | 3/2016 | |
| KR | 10-1602277 B1 | | 3/2016 | |
| KR | 10-2016-009357 A | | 8/2016 | |
| KR | 10-2016-0099357 A | | 8/2016 | |
| KR | 10-1720960 B1 | | 3/2017 | |
| KR | 20170071949 A | * | 6/2017 | |
| KR | 10-2018-0081014 A | | 7/2018 | |
| WO | WO-2017008846 A1 | * | 1/2017 | ............ H02J 7/0029 |
| WO | WO-2017059668 A1 | * | 4/2017 | ............ H02J 7/0018 |
| WO | WO-2018153431 A1 | * | 8/2018 | .............. B60L 58/22 |

OTHER PUBLICATIONS

Extended European Search Report dated Dec. 14, 2020, issued in corresponding European Patent Application No. 19871152.5.

Office Action dated Aug. 20, 2021, issued in corresponding Korean Patent Application No. 2011-182623.

* cited by examiner

BATTERY MANAGEMENT APPARATUS AND METHOD

TECHNICAL FIELD

The present application claims priority to Korean Patent Application No. 10-2018-0122131 filed on Oct. 12, 2018 in the Republic of Korea, the disclosures of which are incorporated herein by reference.

The present disclosure relates to a battery management apparatus and method, and more particularly, to a battery management apparatus and method for balancing voltages of cell assemblies when a battery pack is electrically connected to another battery pack in parallel.

BACKGROUND ART

Recently, due to the depletion of fossil energy and environmental pollution, there is a growing interest in electrical products that may be driven using electrical energy without using fossil energy.

Accordingly, the development and demand for technology of mobile devices, electric vehicles, hybrid electric vehicles, power storage devices and uninterruptible power supplies increase. For this reason, the demand for secondary batteries as energy sources is rapidly increasing, and the types of demand are also diversifying. Thus, many researches on secondary batteries have been conducted to meet various demands.

Meanwhile, in order to drive an electric vehicle or a hybrid electric vehicle, an electric motor requiring a high power must be operated. In addition, a power storage device that powers a building or certain area must provide enough power to meet the demanded power. In order to provide high output or large capacity power, a plurality of cell assemblies, each having unit cell assemblies, are connected in series or in parallel to form a battery pack, thereby supplying a desired output or power.

Further, a plurality of battery packs are connected in parallel and used for a high-performance electric vehicle that requires high capacity. At this time, when the battery packs are connected in parallel, if a voltage difference occurs between the voltages of the battery packs, a high current flows between the battery packs without outputting the voltage to a final output terminal. For this reason, when a voltage difference occurs between the voltages of the battery packs, the battery packs may be overdischarged and the high current may cause damage to electrical components included in each of the battery packs.

DISCLOSURE

Technical Problem

The present disclosure is designed to solve the problems of the related art, and therefore the present disclosure is directed to providing a battery management apparatus and method, which determines whether balancing is required when a battery pack is electrically connected to another battery pack in parallel, and performs balancing by using a balancing resistor if it is determined that balancing is required.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

Various embodiments of the present disclosure to accomplish the above object are as follows. A battery management apparatus according to the present disclosure may comprise: a sensing unit detachably mounted to a battery system and configured to measure a voltage of a cell assembly included in a battery pack, which is electrically connected to another battery pack in parallel, when being mounted to the battery system; a balancing circuit having a balancing resistor connected to a charging and discharging path of the cell assembly in parallel and a balancing switch for electrically connecting or disconnecting the cell assembly and the balancing resistor; and a processor operably coupled to the sensing unit and the balancing circuit.

Preferably, when it is detected that the battery pack is electrically connected to another battery pack in parallel, the processor may determine whether balancing is required between the voltage of the cell assembly and a voltage of a cell assembly included in the another battery pack, and, when it is determined that the balancing is required, the processor may calculate a balancing current of an operation state of each of the balancing switch and a balancing switch included in the another battery pack by using balancing circuit data, compare each of the calculated balancing currents with a reference balancing current, and control the operation state of the balancing switch based on the comparison result.

Preferably, when it is detected that the battery pack is electrically connected to another battery pack in parallel, the processor may send a connection completion signal and a voltage request signal for requesting the voltage of the cell assembly included in the another battery pack to the another battery pack.

Preferably, the processor may compare a voltage difference between the voltage of the cell assembly and the voltage of the cell assembly included in the another battery pack with a reference voltage difference, and determine that the balancing is required when the voltage difference is greater than the reference voltage difference.

Preferably, the processor may calculate the balancing current of the operation state of each of the balancing switch and the balancing switch included in the another battery pack by using balancing circuit data that includes at least one of the voltage of the cell assembly, the voltage of the cell assembly included in the another battery pack, a resistance of the balancing resistor and a resistance of a balancing resistor included in the another battery pack.

Preferably, the processor may control the balancing switch to any one of the operation states of the balancing switch and the balancing switch included in the another battery pack, which correspond to a balancing current smaller than the reference balancing current among the calculated balancing currents.

Preferably, when it is determined that the balancing is required, the processor may calculate a balancing time of the operation state of each of the balancing switch and the balancing switch included in the another battery pack by using balancing circuit data, compare each of the calculated balancing times with a reference balancing time, and control the operation state of the balancing switch based on the comparison result.

Preferably, the processor may calculate the balancing time of the operation state of each of the balancing switch and the balancing switch included in the another battery pack by using balancing circuit data that includes at least one of the voltage of the cell assembly, the voltage of the cell assembly included in the another battery pack, a resistance of the balancing resistor and a resistance of a balancing resistor included in the another battery pack.

Preferably, the processor may control the balancing switch to any one of the operation states of the balancing switch and the balancing switch included in the another battery pack, which correspond to a balancing time smaller than the reference balancing time among the calculated balancing times.

A battery pack according to the present disclosure may comprise the battery management apparatus.

A battery management method according to the present disclosure may use a battery management apparatus including: a sensing unit detachably mounted to a battery system and configured to measure a voltage of a cell assembly included in a battery pack, which is electrically connected to another battery pack in parallel, when being mounted to the battery system; a balancing circuit having a balancing resistor connected to a charging and discharging path of the cell assembly in parallel and a balancing switch for electrically connecting or disconnecting the cell assembly and the balancing resistor; and a processor operably coupled to the sensing unit and the balancing circuit.

The battery management method may comprise: by the processor, detecting whether the battery pack is electrically connected to the another battery pack in parallel; by the processor, determining whether balancing is required between the voltage of the cell assembly and a voltage of a cell assembly included in the another battery pack; when it is determined that the balancing is required, by the processor, calculating a balancing current of an operation state of each of the balancing switch and a balancing switch included in the another battery pack by using balancing circuit data; and by the processor, comparing each of the calculated balancing currents with a reference balancing current and controlling the operation state of the balancing switch based on the comparison result.

Advantageous Effects

According to at least one of embodiments of the present disclosure, when a battery pack is electrically connected to another battery pack in parallel, it is determined whether balancing is required, and then, if it is determined that balancing is required, balancing is performed by using a balancing resistor. Thus, it is possible to protect the battery packs and circuits in the battery packs from a high current that flows due to parallel connection of battery packs with different voltages.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "processor" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Figure 1:
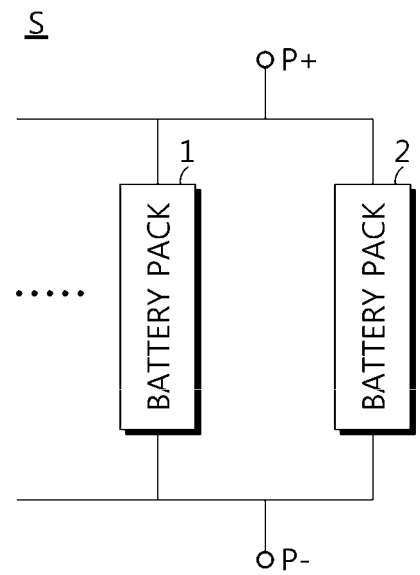
FIG. 1 is a diagram showing that a connection configuration of a battery system to which a battery pack having a battery management apparatus according to an embodiment of the present disclosure and another battery pack are mounted.
Figure 2:
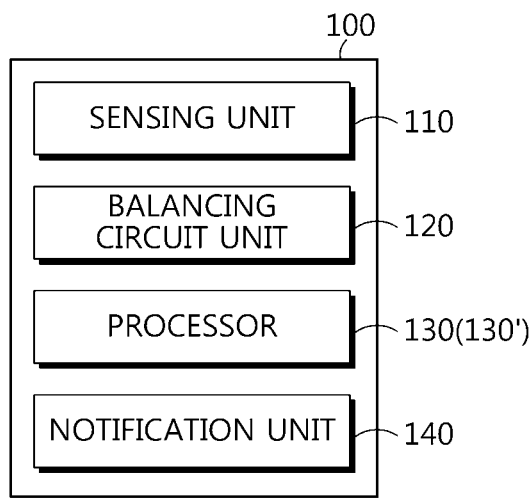
FIG. 2 is a block diagram showing a functional configuration of the battery management apparatus according to an embodiment of the present disclosure.
Figure 3:
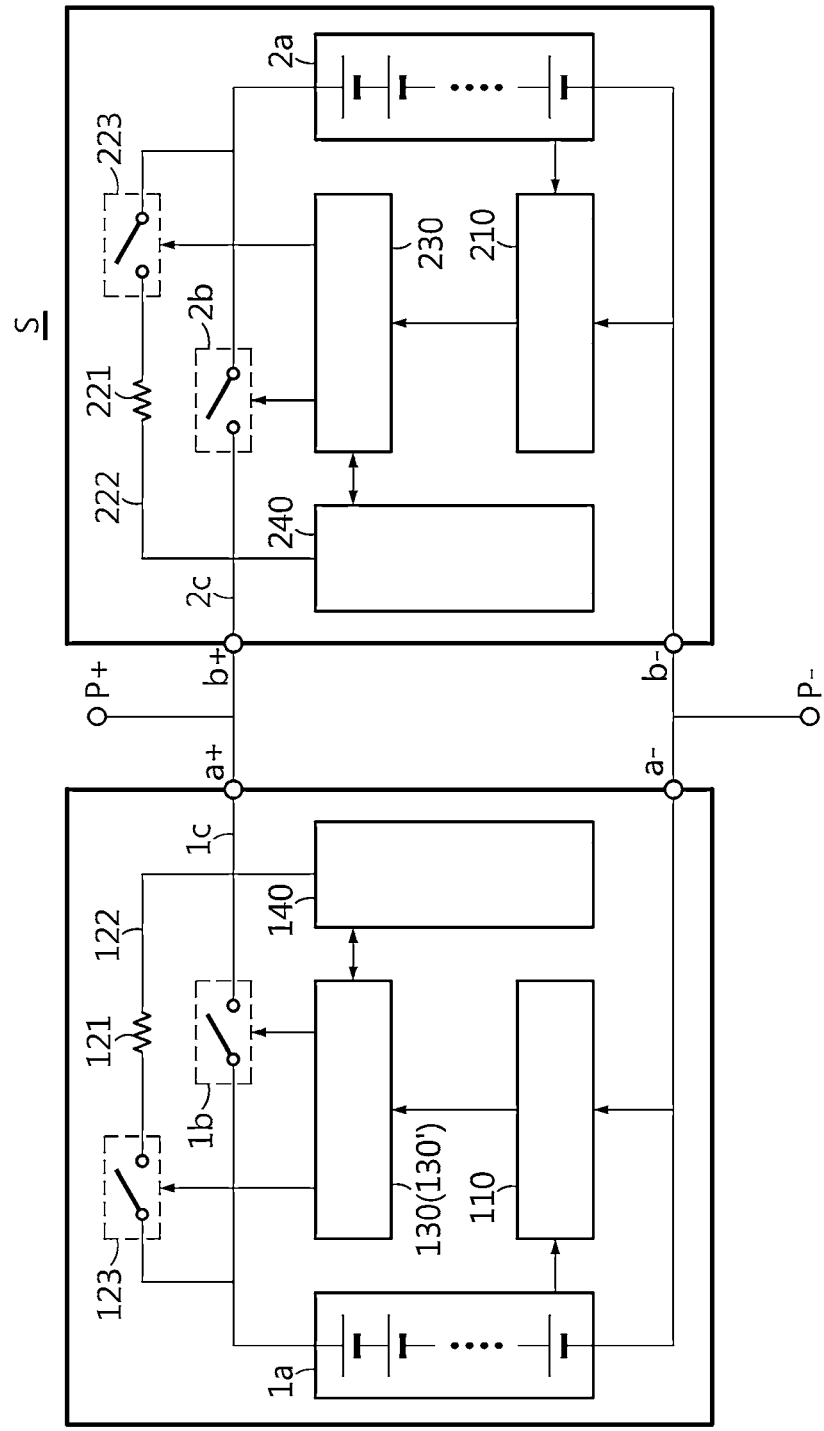
FIG. 3 is a circuit diagram showing a functional configuration of the battery pack having the battery management apparatus according to an embodiment of the present disclosure and another battery pack.

FIG. 1 is a diagram showing that a connection configuration of a battery system S to which a battery pack 1 having a battery management apparatus 100 according to an embodiment of the present disclosure and another battery pack 2 are mounted, FIG. 2 is a block diagram showing a functional configuration of the battery management apparatus 100 according to an embodiment of the present disclosure, and FIG. 3 is a circuit diagram showing a functional configuration of the battery pack 1 having the battery management apparatus 100 according to an embodiment of the present disclosure and another battery pack 2.

Referring to FIGS. 1 to 3, a plurality of battery packs 1, 2 may be mounted to the battery system S. That is, the plurality of battery packs 1, 2 may be detachably mounted to the battery system S. If the battery pack 1 according to an embodiment among the plurality of battery packs 1, 2 is mounted to the battery system S, the battery pack 1 may be electrically connected in parallel with another battery pack 2 that is mounted to the battery system S in advance.

That is, the plurality of battery packs 1, 2 electrically connected in parallel are mounted in the battery system S, and the battery system S may output power to a load through system input and output terminals P+, P−.

In the present specification, the battery system S has been described as having two battery packs 1, 2 mounted thereto, but three or more battery packs may be mounted and connected in parallel to each other.

The battery pack 1 having the battery management apparatus 100 according to an embodiment of the present disclosure may further include a cell assembly 1a, a charging and discharging switch 1b, a charging and discharging path 1c, and pack input and output terminals a+, a−.

The cell assembly 1a may include at least one battery cell. The cell assembly 1a may be electrically connected to the pack input and output terminals a+, a− through the charging and discharging path 1c. Through this, the cell assembly 1a may be charged or discharged by receiving or outputting a current through the charging and discharging path 1c while the charging and discharging switch 1b positioned on the charging and discharging path 1c is turned on. In contrast, the cell assembly 1a may stop charging and discharging while the charging and discharging switch 1b is turned off.

The charging and discharging switch 1b may be controlled by a processor 130 of the battery management apparatus 100, explained later, so that its operation state comes to a turn-on or turn-off state.

The pack input and output terminals a+, a− may be electrically connected to the pack input and output terminals b+, b− of another battery pack 2 mounted to the battery system S and the system input and output terminals P+, P− of the battery system S, respectively.

The battery management apparatus 100 according to an embodiment of the present disclosure may include a sensing unit 110, a balancing circuit 120, a processor 130, and a notification unit 140.

The sensing unit 110 is implemented using application specific integrated circuits (ASICs) or the like and is electrically connected to the cell assembly 1a to measure a voltage of the cell assembly 1a.

For this, the sensing unit 110 may include at least one voltage sensor (not shown).

In addition, the sensing unit 110 may be electrically connected to the charging and discharging path 1c to measure a current flowing in the charging and discharging path 1c.

For this, the sensing unit 110 may include at least one current sensor (not shown).

The sensing unit 110 may output a signal indicating the voltage of the cell assembly 1a and the current of the charging and discharging path 1c to the processor 130.

The balancing circuit 120 may include a balancing resistor 121, a balancing switch 123, and a balancing path 122.

The balancing resistor 121 may be connected in parallel to the charging and discharging path 1c of cell assembly 1a. In addition, the balancing resistor 121 may be connected in parallel to the charging and discharging switch 1b.

For this, the balancing path 122 may electrically connect the balancing resistor 121 and the charging and discharging switch 1b.

The balancing switch 123 may be located on the balancing path 122 to electrically connect or disconnect the cell assembly 1a and the balancing resistor 121. The operation state of the balancing switch 123 may be controlled by the processor 130.

For example, if the balancing switch 123 is kept in the turn-on state and the charging and discharging switch 1b is kept in the turn-off state, the current output from or input to the cell assembly 1a may flow through the balancing resistor 121.

Conversely, if the balancing switch 123 is kept in the turn-on or turn-off state and the charging and discharging switch 1b is kept in the turn-on state, the current output from the cell assembly 1a or input to the cell assembly 1a may flow through the charging and discharging switch 1b without passing through the balancing resistor 121.

The processor 130 may be operably coupled with the sensing unit 110 and the balancing circuit 120.

The processor 130 may detect whether the battery pack 1 is electrically connected to another battery pack 2 in parallel. If it is detected that the battery pack 1 is electrically connected in parallel to another battery pack 2, the processor 130 may determine whether balancing is required between the voltage of the cell assembly 1a and a voltage of a cell assembly 2a included in another battery pack 2.

At this time, if the battery pack 1 is detected to be electrically connected in parallel to another battery pack 2, the processor 130 may maintain both the charging and discharging switch 1b and the balancing switch 123 in the turn-off state.

Meanwhile, another battery pack 2 may also include a battery management apparatus 200, a cell assembly 2a, a charging and discharging switch 2b, a charging and discharging path 2c, and pack input and output terminals b+, b−. In addition, the battery management apparatus 200 included in another battery pack 2 may include a sensing unit 210, a balancing circuit 220, a processor 230 and a notification unit 240 in the same manner as the battery management apparatus 100 according to an embodiment. In addition, the balancing circuit 220 of the battery management apparatus 200 included in another battery pack 2 may include a balancing resistor 221, a balancing switch 223, and a balancing path 222.

If it is detected that the battery pack 1 is electrically connected in parallel to another battery pack 2, the processor 130 may send a connection completion signal and a voltage request signal to another battery pack 2.

Here, the connection completion signal may be a signal indicating that the battery pack 1 and another battery pack 2 are completely electrically connected in parallel. In addition, the voltage request signal may be a signal for requesting the voltage of the cell assembly 2a included in another battery pack 2.

For this, the processor 130 may send the connection completion signal and the voltage request signal to the processor 230 included in another battery pack 2.

If the processor 230 included in another battery pack 2 receives the connection completion signal and the voltage request signal, the processor 230 may send the voltage of the cell assembly 2a included in another battery pack 2 to the processor 130.

The processor 130 may compare a voltage difference between the voltage of the cell assembly 1a and the voltage of the cell assembly 2a included in another battery pack 2 with a reference voltage difference and determine that balancing is required if the voltage difference is greater than the reference voltage difference.

At this time, when the voltage difference is greater than the reference voltage difference, if the charging and discharging switches 1b, 2b are kept in the turn-on state and the balancing switches 123, 223 are kept in the turn-off state, a high current may flow between the cell assemblies 1a, 2a due to the voltage difference in a no-load state. As a result, the high current may flow to the cell assemblies 1a, 2a, the charging and discharging switches 1b, 2b and the processors 130, 230 included in the battery pack 1 and the other battery pack 2, respectively, thereby causing a failure.

To prevent this, if the voltage difference is greater than the reference voltage difference, the processor 130 may determine that balancing is required and perform the balancing.

More specifically, if it is determined that balancing is required, the processor 130 may calculate a balancing current of an operation state of each of the balancing switch 123 and the balancing switch 223 included in another battery pack 2 by using balancing circuit data, compare each of the calculated balancing currents with a reference balancing current and control the operating state of the balancing switch 123 based on the comparison result.

Here, the balancing circuit data may include at least one of the voltage of the cell assembly 1a, the voltage of the cell assembly 2a included in another battery pack 2, a resistance of the balancing resistor 121 and a resistance of the balancing resistor 221 included in another battery pack 2.

Meanwhile, if it is determined that balancing is required, the processor 130 may maintain the charging and discharging switch 1b and the balancing switch 123 in the turn-off state. In addition, the processor 130 may send a turn-off request signal for requesting to maintain the operation states of the charging and discharging switch 2b included in another battery pack 2 and the balancing switch 223 in the turn-off state to the processor 230 included in another battery pack 2.

Thus, if it is determined that balancing is required, the charging and discharging switches 1b, 2b and the balancing switches 123, 223 in the battery system S may be kept in the turn-off state.

After that, if the charging and discharging switches 1b, 2b in the battery system S are in the turn-off state and the balancing switch 123 and the balancing switch 223 included in another battery pack 2 are respectively in the turn-on or turn-off state, the processor 130 may calculate balancing current flowing between the cell assemblies 1a, 2a in the battery system S by using the balancing circuit data.

For example, the processor 130 may calculate the balancing current when the operation state of each of the balancing switch 123 and the balancing switch 223 included in another battery pack 2 is as shown in Table 1 below.

Meanwhile, the processor 130 may calculate the balancing current using Ohm's law.

After that, the processor 130 may control the balancing switch 123 to any one of the operation states of the balancing switch 123 and the balancing switch 223, which correspond to a balancing current smaller than the reference balancing current among the calculated balancing currents.

At this time, the processor 130 may control the balancing switch 123 to an operation state corresponding to a balancing current having the smallest current difference from the reference balancing current among the balancing currents smaller than the reference balancing current.

For example, if the operation state corresponding to the balancing current having the smallest current difference from the reference balancing current among the balancing currents smaller than the reference balancing current is "operation state 2" in Table 1, the processor 130 may control the balancing switch 123 to the turn-on state.

In addition, if the operation state corresponding to the balancing current having the smallest current difference from the reference balancing current among the balancing currents smaller than the reference balancing current is "operation state 2" in Table 1, the processor 130 may send the control request signal to the processor 230 included in another battery pack 2 so that the balancing switch 223 included in another battery pack 2 is controlled to the turn-off state.

According to the present disclosure, even if the voltage difference between the voltage of the cell assembly 1a included in the battery pack 1 and the voltage of the cell assembly 2a included in another battery pack 2 is greater than the reference voltage difference, it is possible to prevent that a high current flows between the cell assemblies 1a, 2a in the battery system S.

After that, if the voltage of the cell assembly 1a included in the battery pack 1 and the voltage of the cell assembly 2a included in the another battery pack 2 become equal, the processor 130 may control the charging and discharging switch 1b to the turn-on state and control the balancing switch 123 to the turn-off state. In addition, if the voltage of the cell assembly 1a included in the battery pack 1 and the voltage of the cell assembly 2a included in another battery pack 2 become equal, the processor 130 may send the control request signal to the processor 230 included in another battery pack 2 so that the charging and discharging switch 2b and the balancing switch 223 included in another battery pack 2 are controlled to the turn-on and turn-off states, respectively.

Meanwhile, when it is determined that balancing is required, a processor 130' according to another embodiment may calculate a balancing time of the operation state of each of the balancing switch 123 and the balancing switch 223 included in another battery pack 2 by using the balancing circuit data, compare each of the balancing times with a reference balancing time, and control the operating state of the balancing switch 123 based on the comparison result.

TABLE 1

| switch | operation state 1 | operation state 2 | operation state 3 |
|---|---|---|---|
| charging and discharging switch 1b of the battery pack 1 | turn-off | turn-off | turn-off |
| balancing switch 123 of the battery pack 1 | turn-on | turn-on | turn-off |
| charging and discharging switch 2b of another battery pack 2 | turn-off | turn-off | turn-off |
| balancing switch 223 of another battery pack 2 | turn-on | turn-off | turn-on |

Specifically, if the charging and discharging switches 1b, 2b in the battery system S are in the turn-off state and the balancing switch 123 and the balancing switch 223 included in another battery pack 2 are in the turn-on or turn-off state, respectively, the processor 130' according to another embodiment may calculate a balancing time at which the voltages of the cell assemblies 1a, 2a in the battery system S become equal, by using the balancing circuit data.

Here, the balancing time may be a time from a time point when the processor 130' according to another embodiment starts controlling the balancing switch 123 for balancing to a time point when the voltages of the cell assemblies 1a, 2a in the battery system S become equal.

For example, the processor 130' may calculate the balancing time if the operation states of the balancing switch 123 and the balancing switch 223 included in another battery pack 2 are as shown in Table 1 above.

Meanwhile, the processor 130' according to another embodiment may calculate the balancing time using Ohm's law and a power formula.

After that, the processor 130' according to another embodiment may control the balancing switch 123 to any one of the operation states of the balancing switch 123 and the balancing switch 223 provided in another battery pack 2, which correspond to the balancing times smaller than the reference balancing time among the calculated balancing times.

At this time, the processor 130' according to another embodiment may control the balancing switch 123 to an operation state corresponding to the shortest balancing time among the balancing times smaller than the reference balancing time.

For example, the processor 130' according to another embodiment may control the balancing switch 123 to the turnoff state if the operation state corresponding to the shortest balancing time among the balancing times smaller than the reference balancing time is "operation state 3" in Table 1.

In addition, when the operation state corresponding to the shortest balancing time among the balancing times smaller than the reference balancing time is "operation state 3" in Table 1, the processor 130' according to another embodiment may send the control request signal to the processor 230 included in another battery pack 2 so that the balancing switch 223 included in another battery pack 2 is controlled to the turn-on state.

According to the present disclosure, balancing may be performed such that the voltage of the cell assembly 1a included in the battery pack 1 and the voltage of the cell assembly 2a included in another battery pack 2 become equal quickly.

Meanwhile, the processor 130, 130' may be is implemented in hardware by using at least one of application specific integrated circuits (ASICs), digital signal processors (DSPs), digital signal processing devices (DSPDs), programmable logic devices (PLDs), field programmable gate arrays (FPGAs), microcontrollers, and electrical units for performing other functions. The processor 130, 130' may have a built-in memory. In the memory, a program for executing a method explained later and various data may be stored. The memory may include, for example, at least type of storage media selected from a flash memory type, a hard disk type, a solid state disk (SSD) type, a silicon disk drive type, a multimedia card micro type, a random access memory (RAM), a static random access memory (SRAM), a read-only memory (ROM), an electrically erasable programmable read-only memory (EEPROM), and a programmable read-only memory (PROM).

The notification unit 140 may receive the determination result of whether balancing is required and whether the balancing is completed from the processor 130, and output the result to the outside. More specifically, the notification unit 140 may include at least one of a display unit for displaying the determination result whether balancing is required and whether the balancing is completed by using at least one of symbols, numbers and codes, and a speaker device for outputting sound.

Hereinafter, a battery management method according to another embodiment of the present disclosure will be described.

Figure 4:
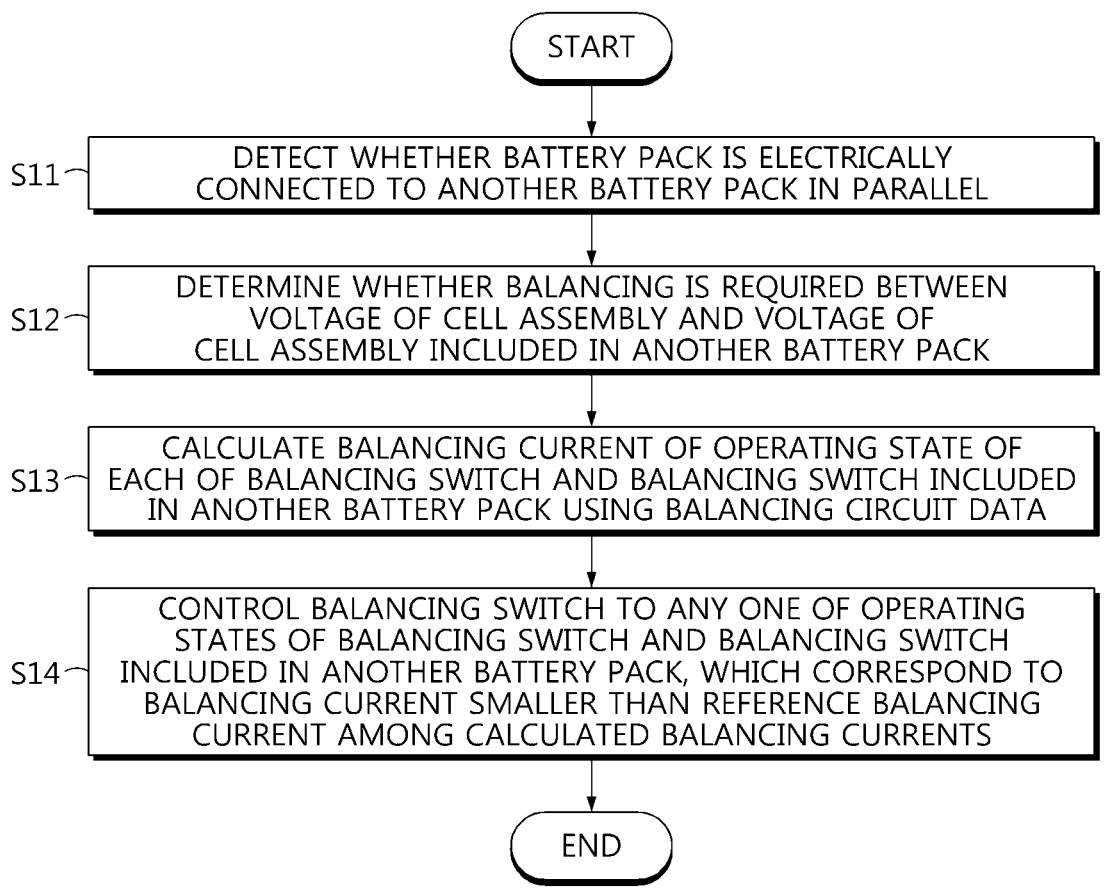
FIG. 4 is a flowchart for illustrating a battery management method according to another embodiment of the present disclosure.

FIG. 4 is a flowchart for illustrating a battery management method according to another embodiment of the present disclosure.

Referring to FIG. 4, the battery management method according to another embodiment of the present disclosure may use the battery management apparatus 100 (FIG. 2) according to an embodiment.

First, in the step S11, the processor 130 may detect whether the battery pack 1 is electrically connected to another battery pack 2 in parallel.

In the step S12, if it is detected that the battery pack 1 is electrically connected in parallel to another battery pack 2, the processor 130 may determine whether balancing is required between the voltage of the cell assembly 1a and the voltage of the cell assembly 2a included in the another battery pack 2.

In the step S13, if it is determined that balancing is required, the processor 130 may calculate a balancing current of the operating state of each of the balancing switch 123 and the balancing switch 223 included in another battery pack 2 by using the balancing circuit data.

In the step S14, the processor 130 may control the balancing switch 123 to any one of the operating states of the balancing switch 123 and the balancing switch 223 included in another battery pack 2, which correspond to the balancing current smaller than the reference balancing current among the calculated balancing currents.

Hereinafter, a battery management method according to still another embodiment of the present disclosure will be described.

Figure 5:
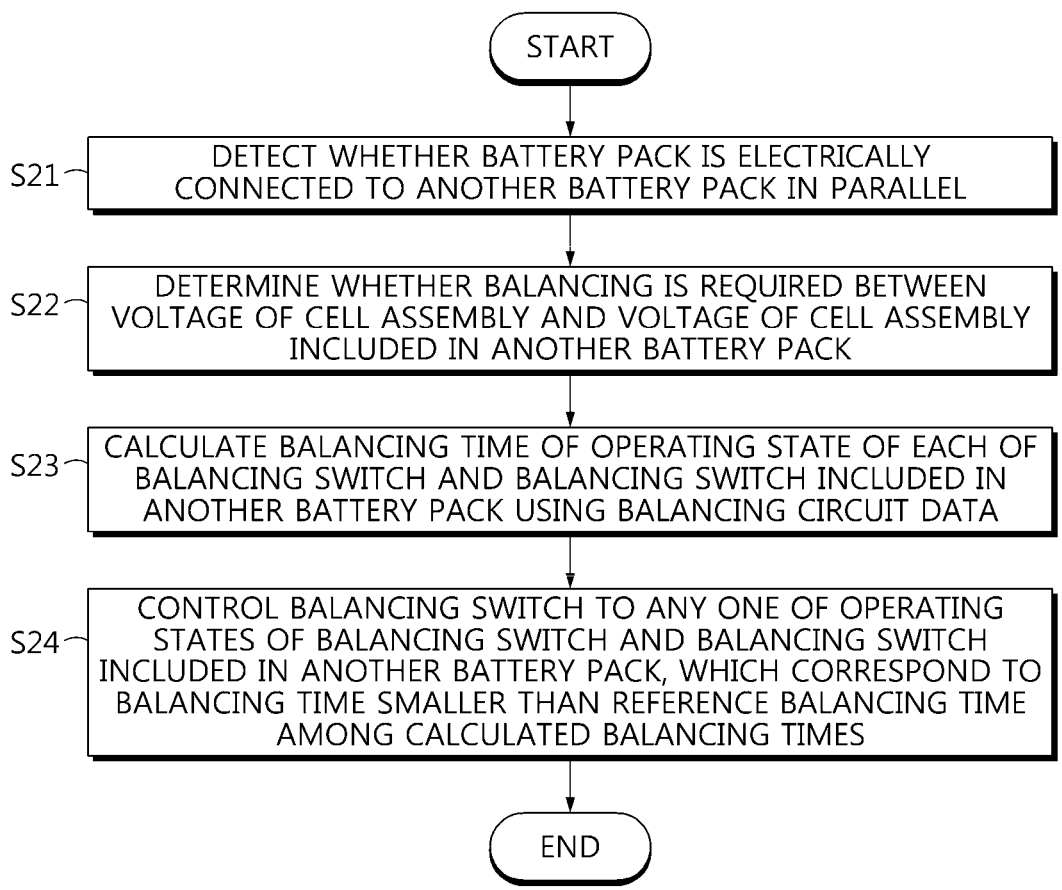
FIG. 5 is a flowchart for illustrating a battery management method according to still another embodiment of the present disclosure.

FIG. 5 is a flowchart for illustrating a battery management method according to still another embodiment of the present disclosure.

Referring to FIG. 5, the battery management method according to still another embodiment of the present disclosure may use the battery management apparatus 100 (FIG. 2) according to an embodiment and the processor 130' according to another embodiment, included therein.

First, in the step S21, the processor 130' according to another embodiment may detect whether the battery pack 1 is electrically connected to another battery pack 2 in parallel.

In the step S22, if it is detected that the battery pack 1 is electrically connected in parallel to another battery pack 2, the processor 130' according to another embodiment may determine whether balancing is required between the voltage of the cell assembly 1a and the voltage of the cell assembly 2a included in the another battery pack 2.

In the step S23, if it is determined that balancing is required, the processor 130' according to another embodiment may calculate a balancing time of the operating state of each of the balancing switch 123 and the balancing switch 223 included in another battery pack 2 by using the balancing circuit data.

In the step S24, the processor 130' according to another embodiment may control the balancing switch 123 to any one of the operating states of the balancing switch 123 and the balancing switch 223 included in another battery pack 2, which correspond to the balancing time smaller than the reference balancing time among the calculated balancing times.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS 1, 2: battery pack
100, 200: battery management apparatus
110, 210: sensing unit
120, 220: balancing circuit
130, 130', 230: processor
140, 240: notification unit

What is claimed is:

1. A battery management apparatus in a battery pack detachably mountable to a battery system, the battery management apparatus comprising:
 a sensing circuit configured to measure a voltage of a cell assembly included in the battery pack, which is configured to be electrically connected to another battery pack in parallel if mounted to the battery system;
 a balancing circuit disposed in the battery pack and comprising:
  a balancing resistor connected to a charging and discharging path of the cell assembly in parallel; and
  a balancing switch for electrically connecting or disconnecting the cell assembly and the balancing resistor; and
 a processor disposed in the battery pack and operably coupled to the sensing circuit and the balancing circuit, the processor being configured to:
  detect whether the battery pack is electrically connected to another battery pack in parallel;
  if the battery pack is detected to be electrically connected to the another battery pack in parallel, determine whether balancing is required between the voltage of the cell assembly in the battery pack and a voltage of a cell assembly included in the another battery pack;
  if the balancing is determined to be required, calculate a balancing current for each of a plurality of operation states of the balancing switch in the battery pack and a balancing switch included in the another battery pack by using balancing circuit data;
  compare each of the calculated balancing currents with a reference balancing current; and
  control the balancing switch of the battery pack based on the comparison result.

2. The battery management apparatus according to claim 1, wherein, if the battery pack is determined to be electrically connected to the another battery pack in parallel, the processor is further configured to send to a processor disposed in the another battery pack:
 a connection completion signal indicating that the battery pack and the another battery pack are electrically connected in parallel, and
 a voltage request signal for requesting the voltage of the cell assembly included in the another battery pack.

3. The battery management apparatus according to claim 1, wherein the processor is further configured to:
 compare a voltage difference between the voltage of the cell assembly in the battery pack and the voltage of the cell assembly included in the another battery pack with a reference voltage difference; and
 determine that the balancing is required if the voltage difference is greater than the reference voltage difference.

4. The battery management apparatus according to claim 1, wherein the balancing circuit data includes at least one of: the voltage of the cell assembly in the battery pack, the voltage of the cell assembly included in the another battery pack, a resistance of the balancing resistor in the battery pack, and a resistance of a balancing resistor included in the another battery pack.

5. The battery management apparatus according to claim 1, wherein, if the balancing is determined to be required, the processor is further configured to control the balancing switch in the battery pack based on one of the operation states of the balancing switch in the battery pack and the balancing switch included in the another battery pack corresponding to a balancing current smaller than the reference balancing current among the calculated balancing currents.

6. The battery management apparatus according to claim 1, wherein, if the balancing is determined to be required, the processor is further configured to:
 calculate a balancing time of each of the operation of each of the balancing switch in the battery pack and the balancing switch included in the another battery pack by using the balancing circuit data;
 compare each of the calculated balancing times with a reference balancing time; and
 control the balancing switch in the battery pack based on the comparison result.

7. The battery management apparatus according to claim 6, wherein the balancing circuit data includes at least one of: the voltage of the cell assembly in the battery pack, the voltage of the cell assembly included in the another battery pack, a resistance of the balancing resistor in the battery pack, and a resistance of a balancing resistor included in the another battery pack.

8. The battery management apparatus according to claim 7, wherein the processor is further configured to control the balancing switch in the battery pack based on one of the operation states of the balancing switch in the battery pack and the balancing switch included in the another battery pack corresponding to a balancing time smaller than the reference balancing time among the calculated balancing times.

9. A battery pack, comprising the battery management apparatus according to claim 1.

10. The battery management apparatus according to claim 2, wherein the processor is further configured to receive the voltage of the cell assembly included in the another battery pack from the processor of the another battery pack in response to the voltage request signal.

11. The battery management apparatus according to claim 1, wherein the operation states of the balancing switch in the battery pack and a balancing switch included in the another battery pack include:
- a first operation state in which both the balancing switch in the battery pack and the balancing switch in the another battery pack are turned on;
- a second operation state in which the balancing switch in the battery pack is turned on, and the balancing switch in the another battery pack is turned off; and
- a third operation state in which the balancing switch in the battery pack is turned off, and the balancing switch in the another battery pack are turned on.

12. The battery management apparatus according to claim 1, wherein the processor is further configured to send a control request signal to a processor of the another battery pack based on the comparison result for controlling the balancing switch in the another battery pack.

13. A battery management method, which uses a battery management apparatus in a battery pack detachably mountable to a battery system and including: a sensing circuit configured to measure a voltage of a cell assembly included in a battery pack, which is configured to be electrically connected to another battery pack in parallel if mounted to the battery system; a balancing circuit disposed in the battery pack and having a balancing resistor connected to a charging and discharging path of the cell assembly in parallel and a balancing switch for electrically connecting or disconnecting the cell assembly and the balancing resistor; and a processor disposed in the battery pack and operably coupled to the sensing circuit and the balancing circuit, the battery management method comprising:
- by the processor, detecting whether the battery pack is electrically connected to the another battery pack in parallel;
- by the processor, if the battery pack is detected to be electrically connected to the another battery pack in parallel, determining whether balancing is required between the voltage of the cell assembly of the battery pack and a voltage of a cell assembly included in the another battery pack;
- if the balancing is determined to be required, by the processor, calculating a balancing current for each of a plurality of operation states of the balancing switch in the battery pack and a balancing switch included in the another battery pack by using balancing circuit data; and
- by the processor, comparing each of the calculated balancing currents with a reference balancing current and controlling the balancing switch in the battery pack based on the comparison result.

14. The battery management method according to claim 13, further comprising:
if the battery pack is determined to be electrically connected to the another battery pack in parallel, sending to a processor disposed in the another battery pack:
- a connection completion signal indicating that the battery pack and the other battery pack are electrically connected in parallel, and
- a voltage request signal for requesting the voltage of the cell assembly included in the another battery pack.

15. The battery management method according to claim 14, further comprising:
receiving the voltage of the cell assembly included in the another battery pack from the processor of the another battery pack in response to the voltage request signal.

16. The battery management method according to claim 13, wherein the operation states of the balancing switch in the battery pack and a balancing switch included in the another battery pack include:
- a first operation state in which both the balancing switch in the battery pack and the balancing switch in the another battery pack are turned on;
- a second operation state in which the balancing switch in the battery pack is turned on, and the balancing switch in the another battery pack is turned off; and
- a third operation state in which the balancing switch in the battery pack is turned off, and the balancing switch in the another battery pack are turned on.

17. The battery management method according to claim 13, further comprising:
sending a control request signal to a processor of the another battery pack based on the comparison result for controlling the balancing switch in the another battery pack.

* * * * *